(12) United States Patent
Doi et al.

(10) Patent No.: US 6,510,392 B2
(45) Date of Patent: Jan. 21, 2003

(54) IN-SITU TEST FOR EMBEDDED PASSIVES

(75) Inventors: Yutaka Doi, Minnetonka, MN (US); Stephen L. Tisdale, Endicott, NY (US)

(73) Assignee: Honeywell Advanced Circuits, Inc., Minnetonka, MN (US)

( * ) Notice: Subject to any disclaimer, the term of this patent is extended or adjusted under 35 U.S.C. 154(b) by 102 days.

(21) Appl. No.: 09/752,659

(22) Filed: Dec. 28, 2000

(65) Prior Publication Data

US 2002/0087277 A1 Jul. 4, 2002

(51) Int. Cl.[7] .............................................. G01R 27/00
(52) U.S. Cl. ......................................... 702/57; 324/525
(58) Field of Search ................................ 702/189, 194, 702/104, 107, 57, 60, 64, 65, 69, 61; 381/56, 94.2; 73/865.9; 324/525, 527, 600, 601, 605, 608, 609, 612, 649, 650, 685, 711, 712, 76.19; 323/233, 364, 368, 320; 361/10, 11, 52, 58, 76; 326/30; 700/293

(56) References Cited

U.S. PATENT DOCUMENTS 3,826,981 A * 7/1974 Ross .......................... 702/198
4,409,543 A * 10/1983 Sugihara ...................... 340/567
5,818,243 A * 10/1998 Wakamatsu ................... 307/39

* cited by examiner

Primary Examiner—Marc S. Hoff
Assistant Examiner—Edward Raymond
(74) Attorney, Agent, or Firm—Rutan & Tucker, LLP; David J. Zoetewey; Robert D. Fish

(57) ABSTRACT

Methods and apparatus for improved impedance measurements are which allow for shorter delays during recalibration and which eliminate the need to physically disconnect and reconnect test leads after initial calibration has been completed. In particular, an adjustment factor is calculated based on impedances measured during initial calibration and is used to adjust future impedance measurements. Moreover, a plurality of loads having pre-measured impedances are switchably connected to the meter such that re-calibration using said loads may be accomplished without the physical connection or disconnection of test leads. The plurality of loads are preferably incorporated into a test board which also comprises additional test leads and a switching mechanism to alternately connect the various loads and test leads to the meter.

14 Claims, 4 Drawing Sheets

10
measuring the impedance of the component three times to obtain a first measured impedance value, a second measured impedance value, and a third measured impedance value

20
multiplying the third measured impedance value by an adjustment factor to obtain a corrected impedance value wherein the adjustment factor is at least partially dependent on both the first measured impedance value and the second measured impedance value

30
utilizing the corrected impedance value as the impedance value of the component. In some instances, the adjustment factor may be equal to a value obtained by dividing the first measured impedance by the second measured impedance

Fig. 1

IN-SITU TEST FOR EMBEDDED PASSIVES

FIELD OF THE INVENTION

The field of the invention is impedance testing systems.

BACKGROUND OF THE INVENTION

Transmitting a sinusoidal signal through a component results in an amplitude change and phase shift of the signal as a result of the impedance of the component. Although the impedance of a component can be measured, the measured impedance varies depending on the frequency of the signal being used. Moreover, it is impossible to accurately measure the impedance of a component without taking into consideration other factors such as the internal impedance of the measurement device (hereinafter "meter") being used to perform the measurement, the impedance of the conductive path/set of test leads used to transmit the signal through the component, and the affect the impedance of the component has on the signal being transmitted by the meter.

In order to compensate for the factors affecting impedance measurement, impedance meters are generally "calibrated" using a fixed frequency signal, calibration loads having known impedances, and a particular set of test leads ("test lead set") which is to be used to couple the component to be measured to the meter. In such instances the test lead set is first used to couple a calibration load to the meter and various adjustments are made to the meter so that it provides an accurate reading of the known impedance of the calibration load despite the affects of the internal impedance of the meter and the impedance of the test lead set on the measurement. The current settings of the meter once it is calibrated are recorded (generally electronically within the meter) as a set for later use when measuring components having impedances comparable to the impedance of the load using the same frequency signal. As the actual impedance of a component can affect the signal being produced by the meter, and because impedances are a function of frequency, and because impedances are likely to vary between test lead sets, it is not uncommon to have several sets of calibration settings recorded and choosing a particular set for use based on the anticipated impedance value of the component, the frequency of the signal being used, and the test lead set being used.

Although such methods provide better measurements despite the affects of frequency, component impedance value, and impedances introduced by the meter and test lead set, they do not accurately compensate for any affects caused by subjecting the test lead set and meter to environmental changes. This inadequacy becomes particularly troublesome when measuring changes in the component's impedance caused by environmental changes. Such measurements are generally part of life cycle testing of circuit boards during which typically involves subjecting the boards to repeated cycling between environmental extremes while concurrently measuring the impact such environmental changes have on the impedances of components imbedded within the circuit board. Although it is possible to isolate the meter from such changes, at least a portion of the conductive path formed by the test lead set will be subjected to the same environmental changes as the circuit board and its components.

One method for compensating for the environmental changes on the test lead set would be to recalibrate the meter/obtain a set of calibration settings in the desired environment. Doing so is problematic, however, because it introduces significant delays into the testing process by requiring that the test lead set be switched, typically manually, between the calibration load(s) and the component(s) to be tested. Moreover, such a switch may not be possible in severe environments. If such were the case, delays would be required to transition between an environment suitable for testing and the more severe test environment, and would possible affect the measurements by introducing a cycle between environments between calibration and component measurement steps.

Thus, there is a continuing need for improved methods and devices of testing, particularly in regard to compensation for impedance changes in caused by fluctuations of environmental factors.

SUMMARY OF THE INVENTION

Methods and apparatus for improved impedance measurements are provided which allow for relatively shorter recalibration delays during testing and which preferably eliminate the need to physically disconnect and reconnect test leads after initial calibration has been completed. In particular, an adjustment factor is calculated based on initial impedance measurements and is used to adjust future impedance measurements taken. Moreover, a plurality of loads having pre-measured impedances are switchably connected to the meter such that re-calibration using said loads preferably can be accomplished without manual connection or disconnection of test lead sets. The plurality of loads are preferably incorporated into a test board which also comprises additional test lead sets and a switching mechanism to alternately connect the various calibration loads and components under test to the meter. In a preferred embodiment, the board is constructed to minimize impedance differences between test lead sets.

Various objects, features, aspects and advantages of the present invention will become more apparent from the following detailed description of preferred embodiments of the invention, along with the accompanying drawings in which like numerals represent like components.

BRIEF DESCRIPTION OF THE DRAWINGS

FIG. 1 is diagram of a first method embodying the invention.

DETAILED DESCRIPTION

Figure 2:
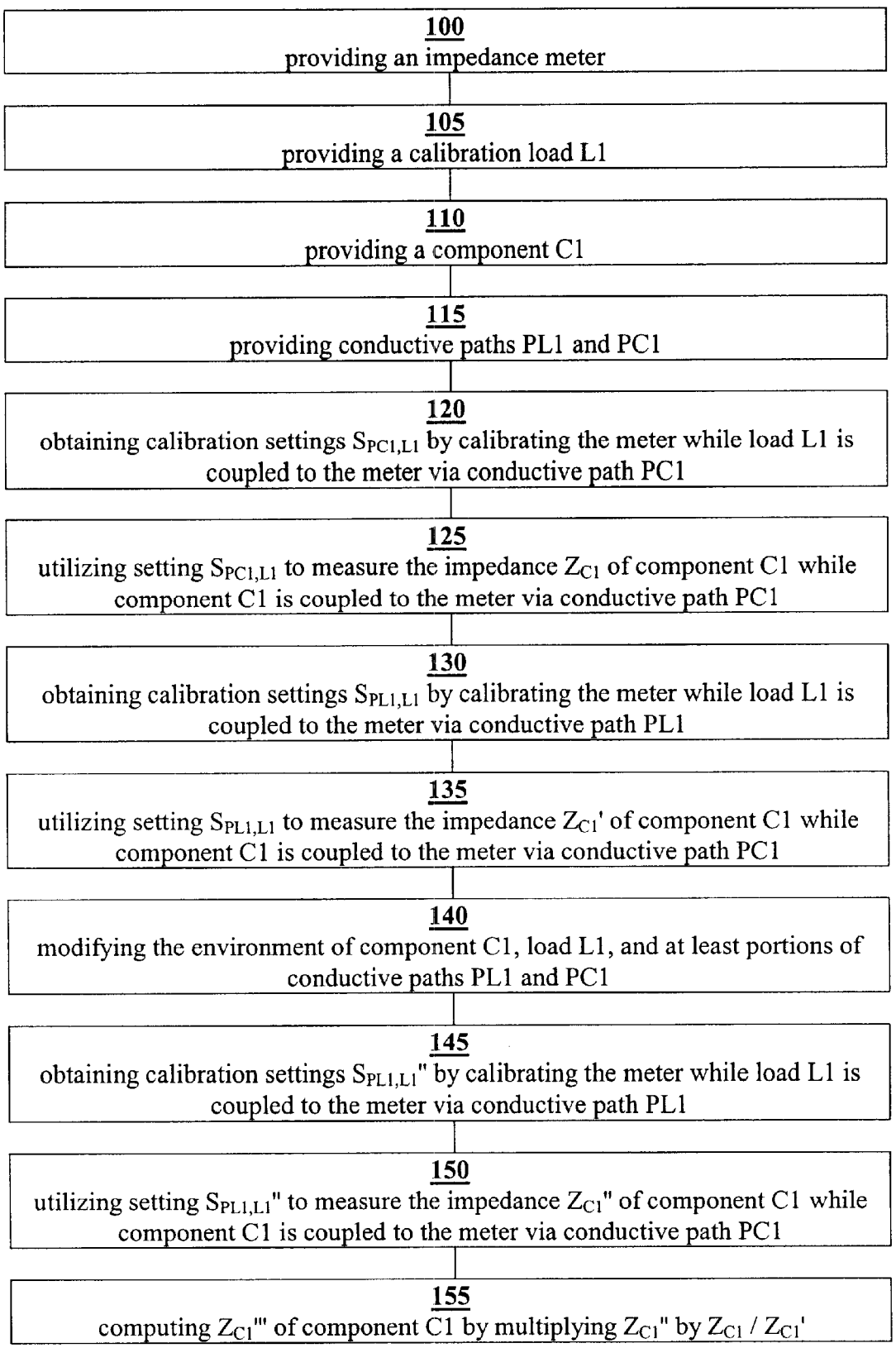
FIG. 2 is diagram of a second method embodying the invention.

Impedance measurement of the components of a circuit board or other device can be accomplished during environmental/life cycle testing of the device without having to interrupt testing to connect and disconnect test lead sets. Instead of using a single test lead set for both measurement and calibration, multiple test lead sets and a scanner/switch are used so that calibration and measurement may be alternately performed without manually connecting and disconnecting calibration loads and components to be tested from the meter. Although this introduces a possible error due to impedance differences between the test lead sets, such error may be minimized by using a computed impedance value rather than the measured impedance value.

In one embodiment, a method for obtaining an impedance value for a component comprises: step 10, measuring the impedance of the component three times to obtain a first measured impedance value, a second measured impedance value, and a third measured impedance value; step 20, multiplying the third measured impedance value by an adjustment factor to obtain a corrected impedance value wherein the adjustment factor is at least partially dependent on both the first measured impedance value and the second measured impedance value; step 30, utilizing the corrected impedance value as the impedance value of the component. In some instances, the adjustment factor may be equal to a value obtained by dividing the first measured impedance by the second measured impedance.

It is preferred that a single impedance meter be used to measure the impedance of the component to obtain the first, second, and third measured impedance values, with the meter being calibrated a first time prior to obtaining the first measured impedance, a second time prior to obtaining the second measured impedance, and a third time prior to obtaining the third measured impedance. The first calibration is accomplished by coupling a calibration load having a known impedance value to the meter via a first component test lead set, and the first measured impedance value is obtained by measuring the impedance of the component while it is attached to the meter using the first component test lead set. The second calibration is accomplished by coupling a calibration load having a known impedance value to the meter via a first calibration load test lead set, and the second measured impedance value is obtained by measuring the impedance of the component while it is attached to the meter using the first component test lead set. The third calibration is accomplished by coupling a calibration load having a known impedance value to the meter via the first calibration load test lead set, and the third measured impedance value is obtained by measuring the impedance of the component while it is attached to the meter using the first component test lead set.

It is contemplated that the methods disclosed herein are particularly advantageous if the first calibration and second calibration are performed and the first and second measured impedance values are obtained while the component is subject to a first set of environmental conditions such as room ambient temperature and humidity, and the third calibration and third measured impedance value are performed and obtained while the component is subject to a second set of environmental conditions significantly different from room ambient conditions. Although "significantly different" will vary depending on circumstances, it is contemplated that two environments having temperatures which differ by at least 10 degrees Celsius may be said to be significantly different.

Referring FIG. 1, a method of impedance measurement comprises: step 100, providing an impedance meter; step 105, providing a calibration load L1 having a known impedance; step 110, providing a component C1; step 115, providing conductive paths PL1 and PC1; step 120, obtaining calibration settings $S_{PC1,L1}$ by calibrating the meter while load L1 is coupled to the meter via conductive path PC1; step 125, utilizing setting $S_{PC1,L1}$ to measure the impedance $Z_{C1}$ of component C1 while component C1 is coupled to the meter via conductive path PC1; step 130, obtaining calibration settings $S_{PL1,L1}$ by calibrating the meter while load L1 is coupled to the meter via conductive path PL1; step 135, utilizing setting $S_{PL1,L1}$ to measure the impedance $Z_{C1}'$ of component C1 while component C1 is coupled to the meter via conductive path PC1; step 140, modifying the environment of component C1, load L1, and at least portions of conductive paths PL1 and PC1; step 145, obtaining calibration settings $S_{PL1,L1}''$ by calibrating the meter while load L1 is coupled to the meter via conductive path PL1; step 150, utilizing setting $S_{PL1,L1}''$ to measure the impedance $Z_{C1}''$ of component C1 while component C1 is coupled to the meter via conductive path PC1; and step 155, computing $Z_{C1}'''$ of component C1 by multiplying $Z_{C1}''$ by $Z_{C1}/Z_{C1}'$.

Figure 3:
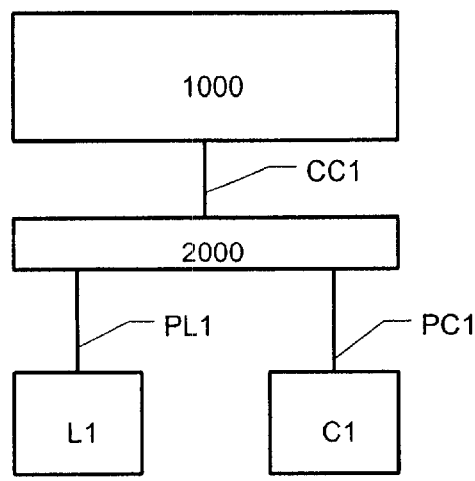
FIG. 3 is a schematic of a first test setup for use in the method of FIG. 2.

Referring to FIG. 3, an impedance measuring instrument/meter 1000 is coupled via communications channel CC1 to a scanner/switch device 2000 which is coupled via detachable conductive paths PL1 and PC1 to calibration load L1 and component C1. It is preferred that the conductive path PL1 and PC1 be as similar to each other as is reasonably possible in regard to their physical composition, dimensions, and positioning relative to each other so as to obtain an essentially equal impedance on both conductive paths PL1 and PC1.

It is contemplated that the test setup shown in FIG. 3 may be advantageously used to implement the method of FIG. 2 as follows:

Steps 100–115, providing a calibration load L1, a component C1, and conductive paths PL1 and PC1 may be accomplished by providing the test setup of FIG. 3.

Step 120, obtaining calibration settings $S_{PC1,L1}$ by calibrating the meter while load L1 is coupled to the meter via conductive path PC1 may be accomplished by: (a) disconnecting conductive path PL1 and PC1 from calibration load L1 and component C1 respectively; (b) reconnecting the conductive path PC1 between the calibration load L1 and switch/scanner 2000; (c) manipulating switch/scanner 2000 such that load L1 is coupled to the meter 1000 via conductive path PC1; (d) calibrating meter 1000 and possibly recording calibration settings $S_{PC1,L1}$.

Step 125, utilizing setting $S_{PC1,L1}$ to measure the impedance $Z_{C1}$ of component C1 while component C1 is coupled to the meter via conductive path PC1 may be accomplished while the meter is still calibrated to settings $S_{PC1,L1}$ by: (a) disconnecting conductive path PC1; (b) reconnecting the conductive path PC1 between the component C1 and switch/scanner 2000; (c) manipulating switch/scanner 2000 such that load C1 is coupled to the meter 1000 via conductive path PC1; (d) measuring the impedance $Z_{C1}$ of component C1.

Step 130, obtaining calibration settings $S_{PL1,L1}$ by calibrating the meter while load L1 is coupled to the meter via conductive path PL1 may be accomplished by: (a) reconnecting the conductive path PL1 between the calibration load L1 and switch/scanner 2000; (b) manipulating switch/scanner 2000 such that load L1 is coupled to the meter 1000 via conductive path PL1; (d) calibrating meter 1000 and possibly recording calibration settings $S_{PL1,L1}$.

Step 135, utilizing setting $S_{PL1,L1}$ to measure the impedance $Z_{C1}'$ of component C1 while component C1 is coupled to the meter via conductive path PC1 may be accomplished by: (a) manipulating switch/scanner 2000 such that load C1 is coupled to the meter 1000 via conductive path PC1; (b) measuring the impedance $Z_{C1}'$ of component C1.

Step 140, modifying the environment of component C1, load L1, and at least portions of conductive paths PL1 and PC1 may be accomplished by: (a) placing component C1, load L1, and at least a portions of conductive paths PL1 and PC1 in an environmental chamber; and (b) modifying the environment within the environmental chamber.

Step 145, obtaining calibration settings $S_{PL1,L1}''$ by calibrating the meter while load L1 is coupled to the meter via conductive path PL1 may be accomplished by: (a) manipulating switch/scanner 2000 such that load L1 is coupled to the meter 1000 via conductive path PC1; (b) calibrating meter 1000 and possibly recording calibration settings $S_{PL1,L1}''$.

Step 150, utilizing setting $S_{PL1,L1}''$ to measure the impedance $Z_{C1}''$ of component C1 while component C1 is coupled to the meter via conductive path PC1 may be accomplished by: (a) manipulating switch/scanner 2000 such that load C1 is coupled to the meter 1000 via conductive path PC1; (b) measuring the impedance $Z_{C1}''$ of component C1.

Step 155, computing $Z_{C1}'''$ of component C1 by multiplying $Z_{C1}''$ by $Z_{C1}/Z_{C1}'$ may be accomplished by an operator either with or without the aid of a computer or other computation device, or may be computed automatically by an automated test system.

Although the discussion thus far has been limited to the use of a single calibration load and a single component, the methods disclosed herein are equally applicable to situations wherein calibration is accomplished using multiple calibration loads and/or wherein the impedances of multiple components are to be measured. Even if multiple calibration loads and or components are involved, the concept remains the same that what is to be done is to (a) simultaneously couple all the calibration loads to be used and components to be tested to a switch/scanner via test lead sets wherein each calibration load and each component has its own corresponding test lead set; (b) temporarily disconnect the calibration load test sets and use standard methods of calibration and measurement involving manual switching of test lead sets between calibration loads and components to measure the impedances of the components using their respective test lead sets; (c) reconnect each of the loads and components via their corresponding test lead set such that all loads and components are simultaneously connected to the switch/scanner; (d) utilize the switch/scanner to switch between loads and components and measure the impedance of each component using the test lead set corresponding to the component while the meter is calibrated using calibration settings obtained by calibrating the meter with each calibration load while each calibration load was coupled to the meter via its corresponding test lead set; (e) repeat the calibrations and measurements of step d after the loads and components have been subjected to an environmental change; and (f) modify the impedance values obtained in step e by multiplying them by ratios of impedances obtained in steps b and d.

Figure 4:
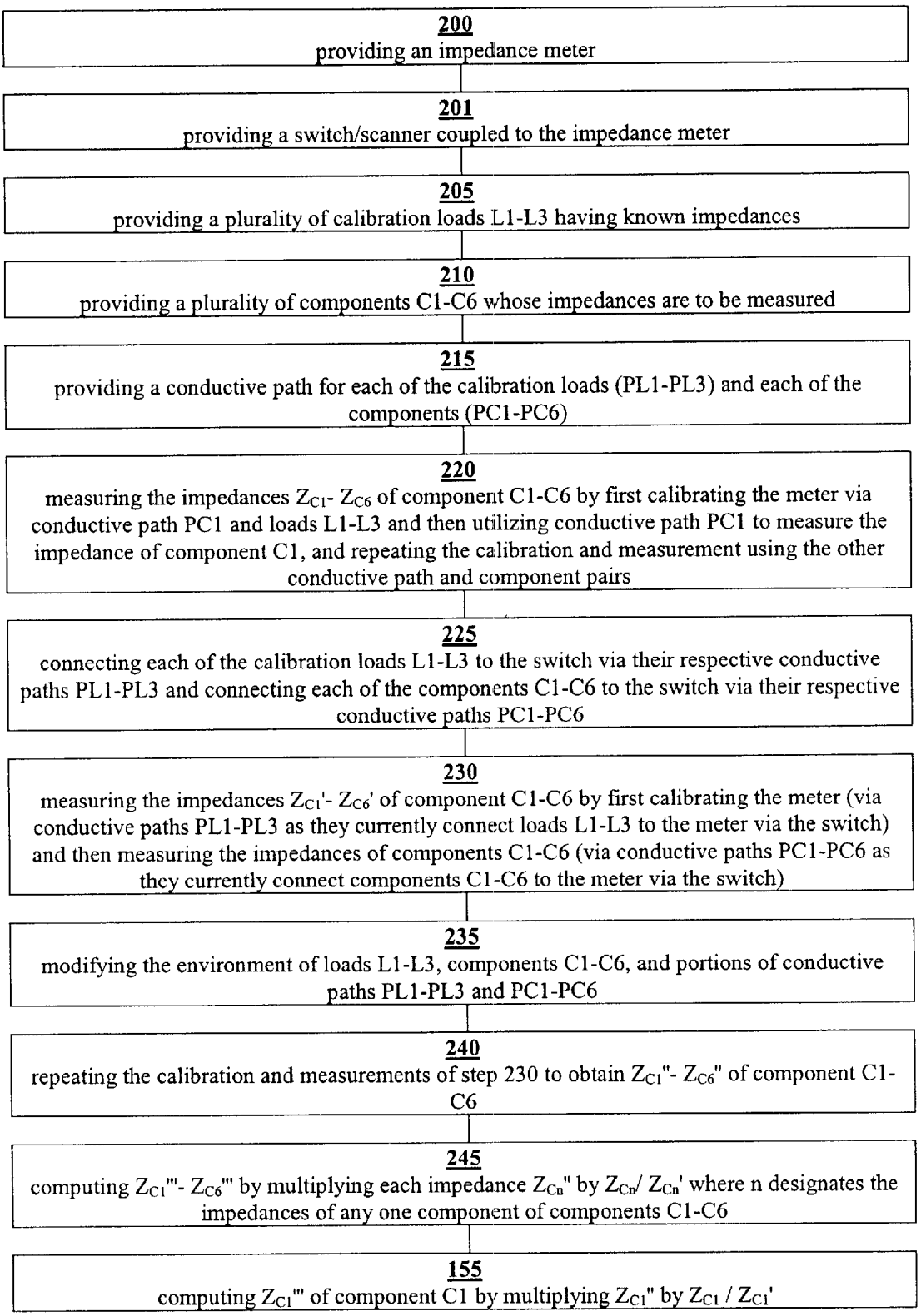
FIG. 4 is diagram of a second method embodying the invention.

Referring to FIG. 4, an embodiment of a multi-load, multi-component method comprises: step 200, providing an impedance meter; step 201, providing a switch/scanner coupled to the impedance meter; step 205, providing a plurality of calibration loads L1–L3 having known impedances; step 210, providing a plurality of components C1–C6 whose impedances are to be measured; step 215, providing a conductive path for each of the calibration loads (PL1–PL3) and each of the components (PC1–PC6); step 220, measuring the impedances $Z_{C1}$–$Z_{C6}$ of component C1–C6 by first calibrating the meter via conductive path PC1 and loads L1–L3 and then utilizing conductive path PC1 to measure the impedance of component C1, and repeating the calibration and measurement using the other conductive path and component pairs; step 225, connecting each of the calibration loads L1–L3 to the switch via their respective conductive paths PL1–PL3 and connecting each of the components C1–C6 to the switch via their respective conductive paths PC1–PC6; step 230, measuring the impedances $Z_{C1}'$–$Z_{C6}'$ of component C1–C6 by first calibrating the meter (via conductive paths PL1–PL3 as they currently connect loads L1–L3 to the meter via the switch) and then measuring the impedances of components C1–C6 (via conductive paths PC1–PC6 as they currently connect components C1–C6 to the meter via the switch); step 235, modifying the environment of loads L1–L3, components C1–C6, and portions of conductive paths PL1–PL3 and PC1–PC6; step 240, repeating the calibration and measurements of step 230 to obtain $Z_{C1}''$–$Z_{C6}''$ of component C1–C6; step 245, computing $Z_{C1}'''$–$Z_{C6}'''$ by multiplying each impedance $Z_{Cn}''$ by $Z_{Cn}/Z_{Cn}'$ where n designates the impedances of any one component of components C1–C6.

Figure 5:
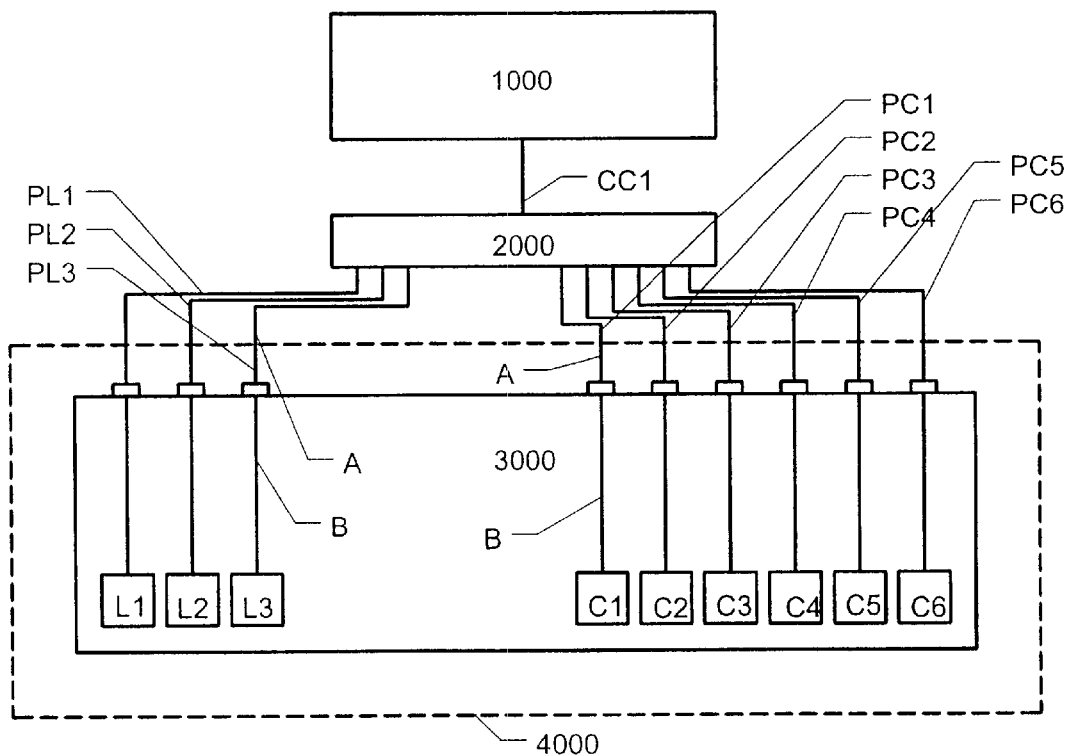
FIG. 5 is a schematic of a second test setup for use in the method of FIG. 4.

Referring to FIG. 5, in a test setup that may be advantageously used to implement the method of FIG. 4 an impedance measuring instrument/meter 1000 is coupled via communications channel CC1 to a scanner/switch device 2000 which is coupled via detachable conductive paths PL1–PL3 and PC1–PC6 to calibration loads L1–L3 and components C1–C6. It is preferred that the conductive path PL1–PL3 and PC1–PC6 be as similar to each other as is reasonably possible in regard to their physical composition, dimensions, and positioning relative to each other so as to obtain an essentially equal impedance on all of the conductive paths PLI–PL3 and PC1–PC6. Loads L1–L3, components C1–C6, and portions of conductive paths PL1–PL3 and PC1–PC6 are mounted on a test board 3000. Each path of conductive paths PL1–PL3 and PC1–PC6 comprises an offboard segment/test lead set A and an onboard segment/trace B, and any switching of conductive paths between loads and components accomplished by disconnecting and reconnecting the offboard segments of the conductive paths PL1–PL3 and PC1–PC6. In many instances, test board 300 will be located within an environmental/accelerated life test chamber 4000 which is used to modify the environment of test board 3000.

Impedance meter 1000 which is used to measure the impedance of components may comprise any type of calibratable impedance measuring device, and may comprise multiple devices. Switch/Scanner 2000 selects one test lead set out of many test lead sets being used to couple calibration loads and components to the switch to allow control over which load or component will have its impedance measured by the meter 1000 at any given time. Switch 2000 may comprise any device or devices capable of coupling any one of a plurality of input lines to meter 1000. Environment chamber 4000 may comprise any device or devices capable of modifying the environment of test board 3000 and the calibration loads and components it comprises.

Although conductive paths PL1–PL3 and PC1–PC6 are represented by signal lines, each conductive path may comprise a plurality of conductors and/or conductor segments. As an example, the offboard/test lead portion A of each conductive will often comprise either a single coaxial line/cable or a pair of coaxial lines/cables depending on whether a two or four terminal test method is used.

As previously discussed, it is preferable that the various described conductive paths have essentially equal impedances. To that end, it is preferable that the offboard/test lead portions of the conductive paths have essentially equal impedances and that the onboard/trace portions of the conductive paths also have impedances essentially equal to each other.

Test board 3000 preferably comprises a plurality of calibration loads having known impedances, a plurality of components to be measured, connectors providing a mechanism for coupling the onboard portions/traces of the conductive paths to the offboard/test lead portions of the conductive paths. The connects of the test board will have matched impedances, as will the traces coupling the connectors to the loads and components. Matched impedances as used herein indicates that the size, shape, and positioning of the traces is chosen to minimize the differences in impedance between them. Although identical impedances are not practicably achievable, it is contemplated that the difference in the impedance values between traces will be less than 10%, and that the difference in the impedance values of the connectors will be less than 10%.

It is contemplated that in some embodiments, switch 2000 will be positioned within the environmental chamber, and possibly be included on test board 3000. In other embodiments, switch 2000 may be incorporated into meter 1000.

Thus, specific embodiments and applications of methods and devices for impedance measurement have been disclosed. It should be apparent, however, to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

What is claimed is:

1. A method for obtaining an impedance value for a component comprising:
   measuring the impedance of the component at least three times to obtain a first measured impedance value, a second measured impedance value, and a third measured impedance value;
   multiplying the third measured impedance value by an adjustment factor to obtain a corrected impedance value;
   utilizing the corrected impedance value as the impedance value of the component;
   wherein the adjustment factor is at least partially dependent on both the first measured impedance value and the second measured impedance value.

2. The method of claim 1 wherein the adjustment factor is equal to a value obtained by dividing the first measured impedance by the second measured impedance.

3. The method of claim 2 wherein a single impedance meter is used to measure the impedance of the component to obtain the first, second, and third measured impedance values, the meter being calibrated a first time prior to obtaining the first measured impedance, a second time prior to obtaining the second measured impedance, and a third time prior to obtaining the third measured impedance.

4. The method of claim 3 wherein:
   the first calibration is accomplished by coupling a calibration load having a known impedance value to the meter via a first component test lead set, and the first measured impedance value is obtained by measuring the impedance of the component while it is attached to the meter using the first component test lead set;
   the second calibration is accomplished by coupling a calibration load having a known impedance value to the meter via a first calibration load test lead set, and the second measured impedance value is obtained by measuring the impedance of the component while it is attached to the meter using the first component test lead set;
   the third calibration is accomplished by coupling a calibration load having a known impedance value to the meter via the first calibration load test lead set, and the third measured impedance value is obtained by measuring the impedance of the component while it is attached to the meter using the first component test lead set.

5. The method of claim 4 wherein the first calibration and second calibration are performed and the first and second measured impedance values are obtained while the component is subjected to a first set of environmental conditions; and the third calibration and third measured impedance value are performed and obtained while the component is subjected to a second set of environmental conditions.

6. The method of claim 5 wherein the first set of environmental conditions and the second set of environmental conditions comprise temperatures which differ by at least 10 degrees Celsius.

7. The method of claim 1 wherein the adjustment factor is at least partially dependent on the impedance values of two separate test lead sets.

8. A method of impedance measurement comprises:
   providing an impedance meter;
   providing a calibration load L1;
   providing a component C1;
   providing conductive paths PL1 and PC1;
   calibrating the meter while load L1 is coupled to the meter via conductive path PC1;
   utilizing setting $S_{PC1,L1}$ to measure the impedance $Z_{C1}$ of component C1 while component C1 is coupled to the meter via conductive path PC1;
   calibrating the meter while load L1 is coupled to the meter via conductive path PL1;
   utilizing setting $S_{PL1,L1}$ to measure the impedance $Z_{C1}'$ of component C1 while component C1 is coupled to the meter via conductive path PC1;
   modifying the environment of component C1, load L1, and at least portions of conductive paths PL1 and PC1;
   obtaining calibration settings $S_{PL1,L1}''$ by calibrating the meter while load L1 is coupled to the meter via conductive path PL1;
   utilizing setting $S_{PL1,L1}''$ to measure the impedance $Z_{C1}''$ of component C1 while component C1 is coupled to the meter via conductive path PC1;
   computing $Z_{C1}'''$ of component C1 by multiplying $Z_{C1}''$ by $Z_{C1}/Z_{C1}'$.

9. The method of claim 8 wherein the conductive paths PL1 and PC1 each comprise a test lead portion and a trace portion, the method further comprising providing a test board, the test board comprising load L1, component C1, the trace portion of conductive path PL1, the trace portion of conductive path PC1, a first connector for coupling together the test lead portion and trace portion of conductive path PL1, a second connector for coupling together the test lead portion and trace portion of conductive path PC1, wherein trace portion of conductive path PC1 and the trace portion of conductive path PL1 have substantially the same physical dimensions and composition.

10. The method of claim 9 wherein the trace portion of the conductive path PC1 and the trace portion of the conductive path PL1 differ in impedance by less than 10%.

11. The method of claim 9 wherein the trace portion of the conductive path PC1 and the trace portion of the conductive path PL1 differ in length by less than 1%.

12. The method of claim 9 wherein the trace portion of the conductive path PC1 and the trace portion of the conductive path PL1 have total areas which differ by less than 2%.

13. The method of claim 9 wherein the test board comprises additional loads having known impedances which are used in calibrating the meter.

14. A test board comprising:
   a set of calibration loads having known impedances;
   a set of components for which impedances are to be determined;
   a plurality of connector sets;
   a plurality of trace sets;
   wherein
      each calibration load of the set of calibration loads has a corresponding trace set and connector set,
      each component of the set of components has a corresponding trace set and connector set,
      each connector of each connector set of the plurality of connector sets having a composition and dimensions substantially the same as a corresponding connector in every other connector set of the plurality of connector sets,
      each trace of each trace set of the plurality of trace sets having a composition and dimensions substantially the same as a corresponding trace in every other trace set of the plurality of trace sets,
      each connector of each connector set of the plurality of connector sets being sized and dimensioned to electrically couple the test board to an external testing device,
      the traces of the trace set and connectors of the connector set corresponding to a particular calibration load or component being electrically disjoint from the traces and connectors of the trace sets and connector sets corresponding to other calibration loads or components such that current does not flow between noncorresponding trace sets or connector sets.

* * * * *